(12) United States Patent
Kang et al.

(10) Patent No.: US 11,075,193 B2
(45) Date of Patent: Jul. 27, 2021

(54) SEMICONDUCTOR PACKAGE

(71) Applicant: SAMSUNG ELECTRONICS CO., LTD., Suwon-si (KR)

(72) Inventors: Myung Sam Kang, Suwon-si (KR); Young Gwan Ko, Suwon-si (KR); Yong Jin Park, Suwon-si (KR); Seon Hee Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 69 days.

(21) Appl. No.: 16/418,885

(22) Filed: May 21, 2019

(65) Prior Publication Data
US 2020/0144235 A1 May 7, 2020

(30) Foreign Application Priority Data
Nov. 6, 2018 (KR) .................. 10-2018-0135186

(51) Int. Cl.
H01L 23/552 (2006.01)
H01L 25/16 (2006.01)
H01L 23/498 (2006.01)
H01L 21/56 (2006.01)
H01L 23/00 (2006.01)
H01L 21/48 (2006.01)

(52) U.S. Cl.
CPC ............ H01L 25/16 (2013.01); H01L 21/481 (2013.01); H01L 21/56 (2013.01); H01L 23/49822 (2013.01); H01L 23/49827 (2013.01); H01L 23/49838 (2013.01); H01L 23/552 (2013.01); H01L 24/24 (2013.01); H01L 24/25 (2013.01); H01L 2224/24155 (2013.01); H01L 2224/25171 (2013.01); H01L 2924/19105 (2013.01)

(58) Field of Classification Search
CPC .................. H01L 21/481; H01L 21/56; H01L 2221/68345; H01L 2224/04105; H01L 2224/12105; H01L 2224/24155; H01L 2224/25171; H01L 2224/96; H01L 23/49822; H01L 23/49827; H01L 23/50; H01L 2924/19105
USPC ........................................................ 257/659
See application file for complete search history.

(56) References Cited

U.S. PATENT DOCUMENTS

| 9,466,545 | B1 | 10/2016 | Scanlan et al. | |
| 9,865,566 | B1 | 1/2018 | Yu et al. | |
| 2016/0260684 | A1* | 9/2016 | Zhai | H01L 25/0652 |
| 2016/0338202 | A1* | 11/2016 | Park | H01L 24/00 |
| 2019/0371626 | A2* | 12/2019 | Chew | H01L 21/561 |
| 2020/0303314 | A1* | 9/2020 | Kang | H01L 23/5386 |

* cited by examiner

Primary Examiner — Theresa T Doan
(74) Attorney, Agent, or Firm — Sughrue Mion, PLLC

(57) ABSTRACT

A semiconductor package includes a connection structure including an insulating layer, a redistribution layer disposed on the insulating layer, and a connection via penetrating through the insulating layer and connected to the redistribution layer, a frame disposed on the connection structure and having a through-hole, a semiconductor chip disposed in the through-hole on the connection structure and having a connection pad disposed to face the connection structure, and a passive component disposed on the frame.

21 Claims, 14 Drawing Sheets

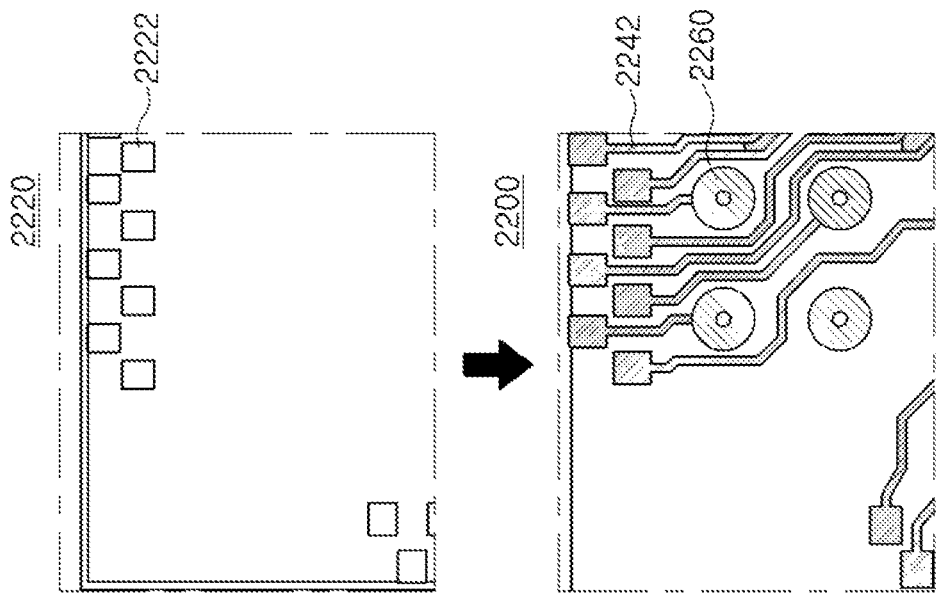
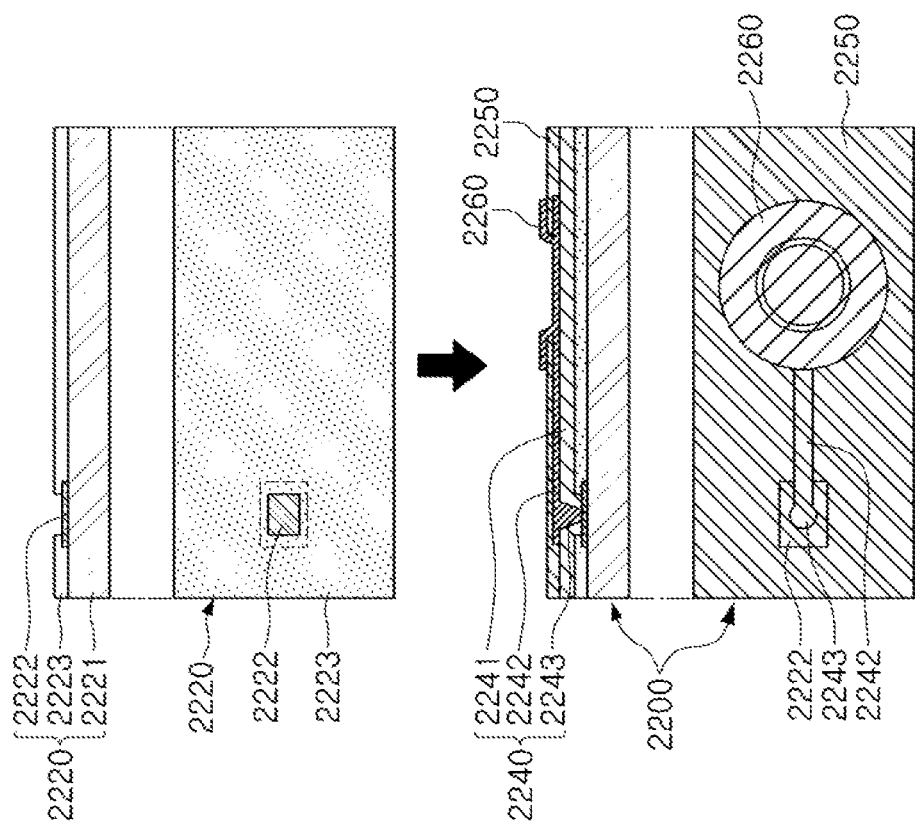
FIG. 3B
FIG. 3A

SEMICONDUCTOR PACKAGE

CROSS-REFERENCE TO RELATED APPLICATION(S)

This application claims benefit of priority to Korean Patent Application No. 10-2018-0135186 filed on Nov. 6, 2018 in the Korean Intellectual Property Office, the disclosure of which is incorporated herein by reference in its entirety.

TECHNICAL FIELD

The present disclosure relates to a semiconductor package in which a semiconductor chip is modularized into a single package together with passive components.

BACKGROUND

In accordance with an increase in a size of displays for mobile devices, the necessity to increase capacity of batteries has increased. In accordance with the increase in the capacity of the batteries, an area occupied by the battery in the mobile device has increased, and it has been thus required to reduce a size of a printed circuit board (PCB). Therefore, an area in which components are mounted has reduced, such that an interest in modularization has continuously increased.

Meanwhile, an example of the related art of mounting a plurality of components may include chip on board (COB) technology. A COB manner is a manner of mounting individual passive elements and a semiconductor package on a printed circuit board such as a main board. However, such a manner has an advantage in terms of a cost, but a wide mounted area is required to maintain a minimum interval between components, electromagnetic interference (EMI) between the components is large, and a distance between the semiconductor chip and the components is great, which results in increasing electrical noise.

SUMMARY

An aspect of the present disclosure may provide a semiconductor package having a novel structure capable of significantly reducing a mounting area of a semiconductor chip and passive components, and being surface-mounted and tuning capacity by disposing the passive components on a frame.

According to an aspect of the present disclosure, a semiconductor package may include a connection structure including an insulating layer, a redistribution layer disposed on the insulating layer, and a connection via penetrating through the insulating layer and connected to the redistribution layer, a frame disposed on the connection structure and having a through-hole, a semiconductor chip disposed in the through-hole on the connection structure and having a connection pad facing the connection structure, and a passive component disposed on the frame.

The semiconductor package may further include a first encapsulant covering at least a portion of the semiconductor chip and a second encapsulant covering at least a portion of the passive component.

The second encapsulant may cover the first encapsulant.

The first and second encapsulants may form a discontinuous interface.

The first encapsulant may be an Ajinomoto Build-up Film (ABF) layer, and the second encapsulant may be a molding layer.

The semiconductor package may further include a heterogeneous material layer embedded in the first encapsulant and having one surface exposed from a side surface of the encapsulant.

The second encapsulant may cover the one surface of heterogeneous material layer exposed from the first encapsulant.

A surface of the heterogeneous material layer opposing the one surface thereof exposed from the first encapsulant may be substantially coplanar with a side surface of the frame facing the semiconductor chip.

The heterogeneous material layer may be formed of the same material as that of the frame, and may be formed of a material different from that of the first encapsulant.

The first encapsulant may cover an upper surface of the semiconductor chip while filling the through-hole, and may be extended to cover a portion of an upper surface of the frame.

The semiconductor package may further include a wiring layer disposed on an upper surface of the frame, and the passive component may be surface-mounted on the wiring layer.

The outermost layer of an external electrode of the passive component may include a tin (Sn) component.

A portion of the wiring layer may be an etch stop layer disposed around the semiconductor chip, and the first encapsulant may cover a portion of an upper surface of the etch stop layer.

The semiconductor package may further an insulating layer disposed on the upper surface of the frame and having an opening exposing a portion of the wiring layer, and the insulating layer may be spaced apart from the first encapsulant and cover a portion of the upper surface of the etch stop layer.

The insulating layer and the first encapsulant may be formed of the same material.

A thickness of a portion of the insulating layer disposed on the frame may be less than a thickness of a portion of the first encapsulant disposed on the upper surface of the frame.

The semiconductor package may further a solder filling at least a portion of the opening in the insulating layer and disposed between the external electrode of the passive component and the portion of the wiring layer.

The second encapsulant may contact the etch stop layer.

The etch stop layer may have a dimple which is filled with a portion of the second encapsulant.

The wiring layer may be disposed on a level between an active surface of the semiconductor chip on which the connection pad is disposed and an inactive surface of the semiconductor chip opposing the active surface.

The semiconductor package may further include an electromagnetic wave shielding layer disposed on a surface of the second encapsulant.

The electromagnetic wave shielding layer may be extended from the surface of the second encapsulant to cover side surfaces of the frame and the connection structure.

The electromagnetic wave shielding layer may be connected to a portion of the redistribution layer of the connection structure.

According to an aspect of the present disclosure, a semiconductor package may include a frame including a wiring via embedded in the frame, and having a through-hole, first and second wiring layers attached to the frame and connected to each other through at least the wiring via, a semiconductor chip disposed in the through-hole and having a connection pad, a connection structure, on which the semiconductor chip and the frame are disposed, including an insulating layer, a redistribution layer disposed on the insulating layer, and connection vias penetrating through the insulating layer and respectively connecting to the connection pad and the second wiring to the redistribution layer, and a passive component disposed on the first wiring and spaced apart from the connection structure.

The semiconductor package may further include a first encapsulant covering at least a portion of the semiconductor chip, and a second encapsulant covering at least a portion of the passive component and covering at least a portion of the first encapsulant.

The first and second encapsulants may be made of different materials.

The semiconductor package may further include a heterogeneous material layer embedded in the first encapsulant, made of a material different from that of the first encapsulant, and having one surface exposed from a side surface of the encapsulant. The exposed one surface of the heterogeneous material layer may be covered by the second encapsulant.

A portion of the first wiring layer may be an etch stop layer, and a portion of the etch stop layer contacts a portion of the second encapsulant.

The semiconductor package may further include insulating layers, disposed on the frame and on opposite sides of the portion of the second encapsulant which contacts the portion of the etch stop layer. The insulating layers may be made of the same material and have different thicknesses.

The etch stop layer may have a dimple filled with the portion of the second encapsulant.

The semiconductor package may further include an electromagnetic wave shielding layer disposed on a surface of the second encapsulant, and extending from the surface of the second encapsulant to cover side surfaces of the frame and the connection structure.

The semiconductor package may further include a solder connecting the passive component and the first wiring layer to each other.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
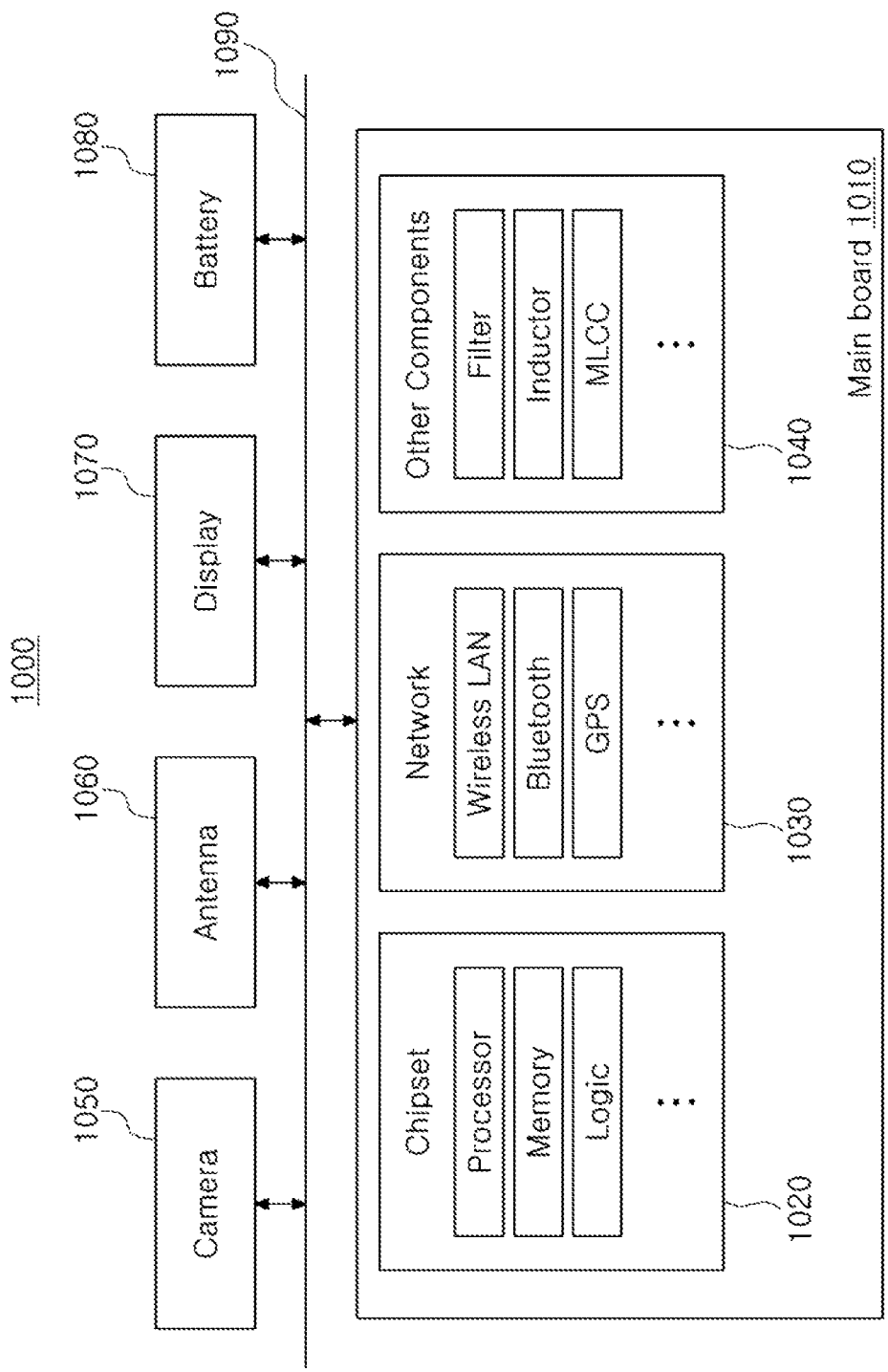
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
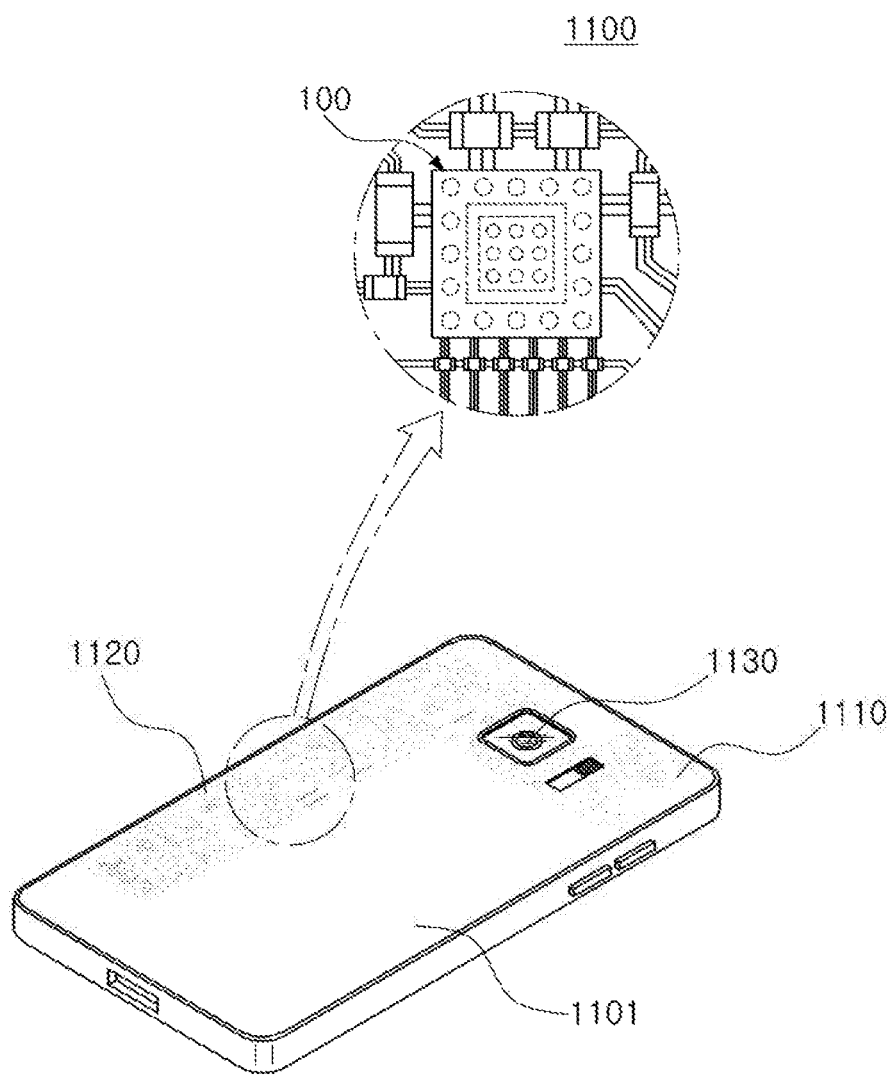
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
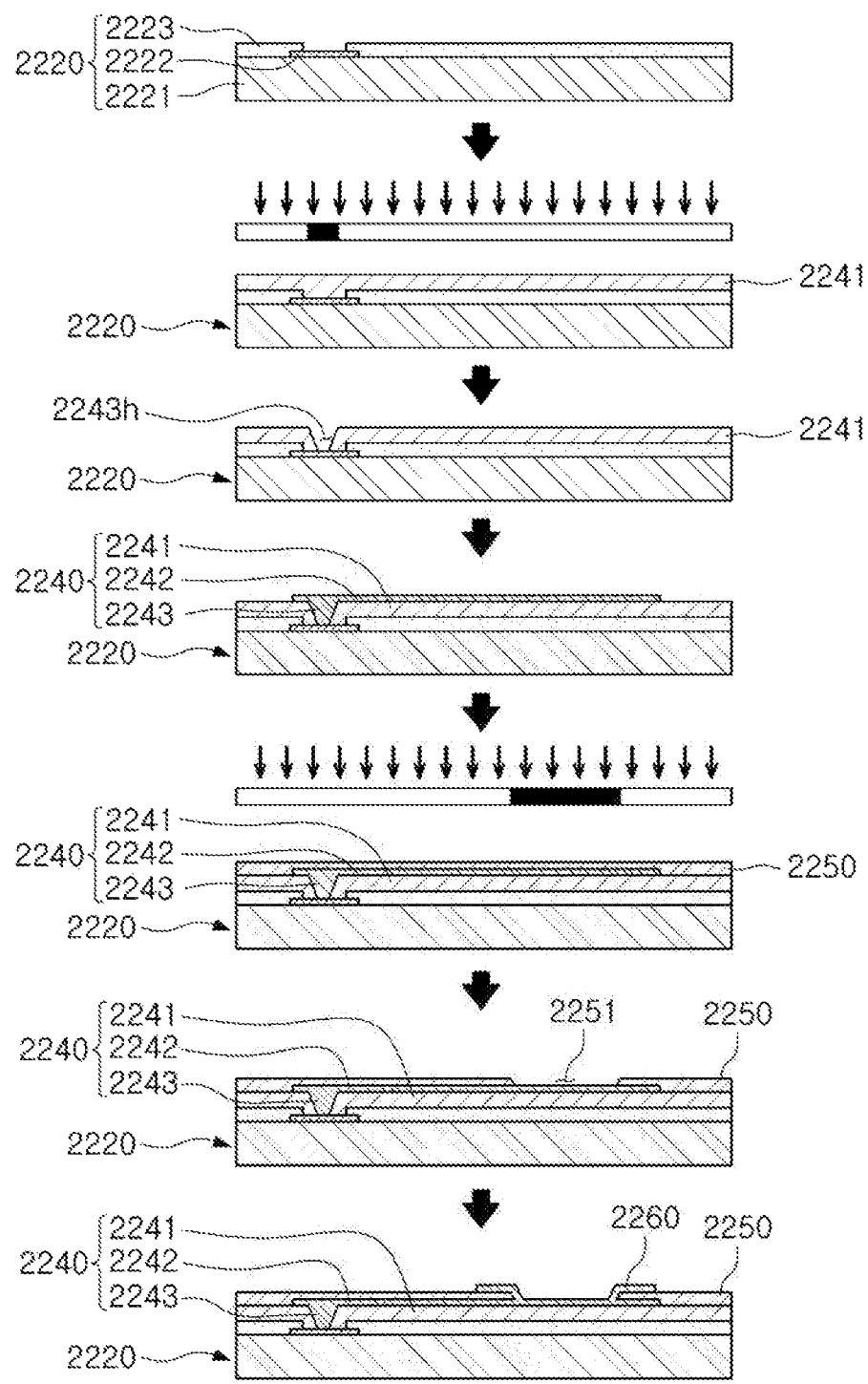
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
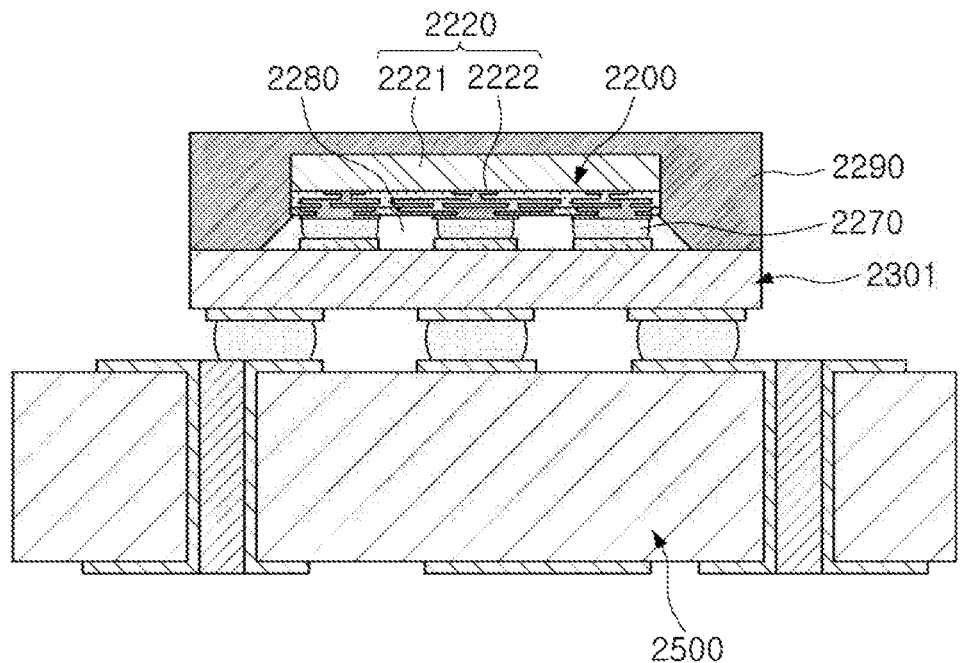
FIG. 5 is a schematic cross-sectional view illustrating a case in which a fan-in semiconductor package is mounted on a printed circuit board and is finally mounted on a main board of an electronic device.

FIG. 5 is a schematic cross-sectional view illustrating a case in which a fan-in semiconductor package is mounted on a printed circuit board and is finally mounted on a main board of an electronic device.

Figure 6:
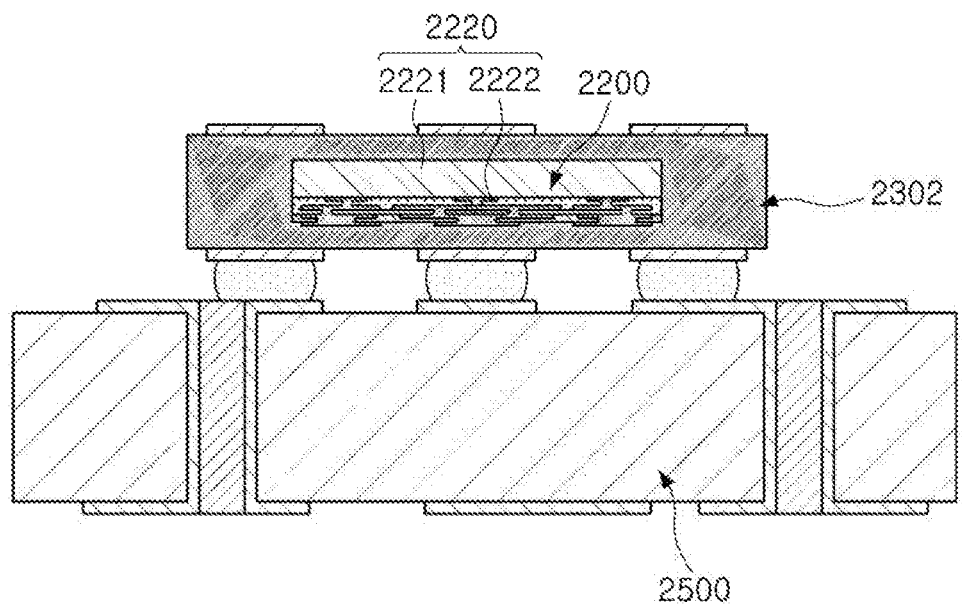
FIG. 6 is a schematic cross-sectional view illustrating a case in which a fan-in semiconductor package is embedded in a printed circuit board and is finally mounted on a main board of an electronic device.

FIG. 6 is a schematic cross-sectional view illustrating a case in which a fan-in semiconductor package is embedded in a printed circuit board and is finally mounted on a main board of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be finally mounted on a main board 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate printed circuit board and be then mounted on the main board of the electronic device through a packaging process or may be mounted and used on the main board of the electronic device in a state in which it is embedded in the printed circuit board.

Fan-Out Semiconductor Package

Figure 7:
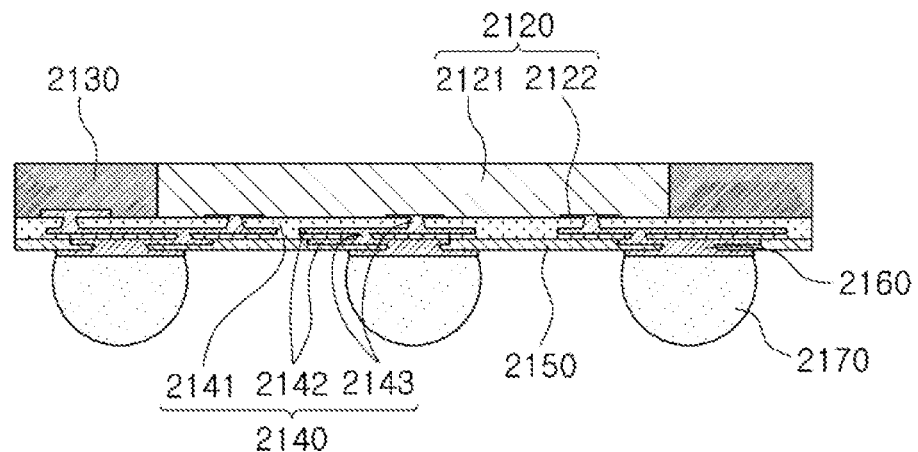
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. Here, a passivation layer 2150 may be further formed on the connection structure 2140, and underbump metal layers 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2241, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate printed circuit board, as described below.

Figure 8:
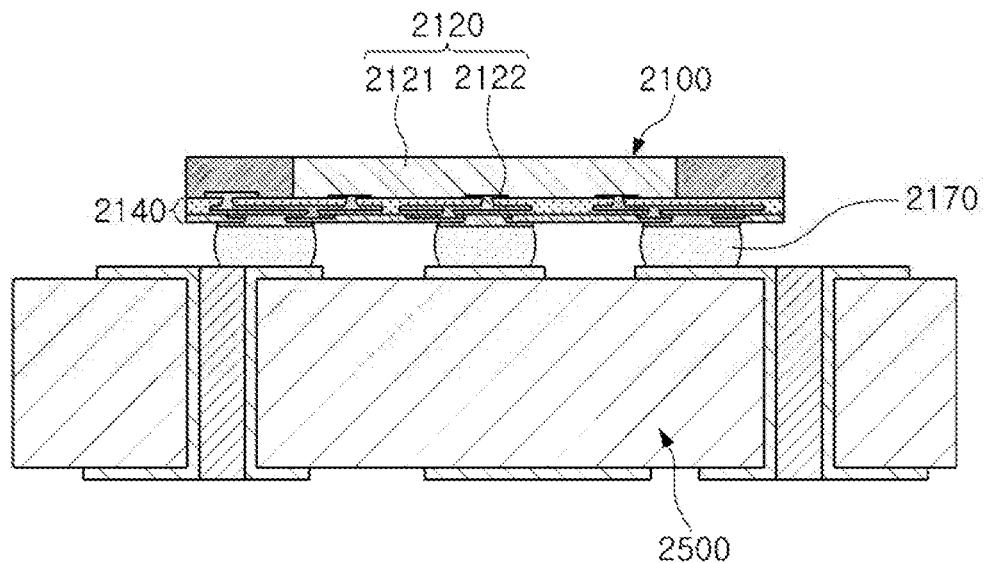
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a printed circuit board, or the like.

As described above, since the fan-out semiconductor package may be mounted on the main board of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package having a novel structure capable of significantly reducing a mounting area of a semiconductor chip and a passive component, significantly reducing an electrical path between the semiconductor chip and the passive component, significantly reducing a process defect such as undulation or crack, and easily connecting electrodes of the passive component with connection vias by machining via holes will be described with reference to the accompanying drawings.

Figure 9:
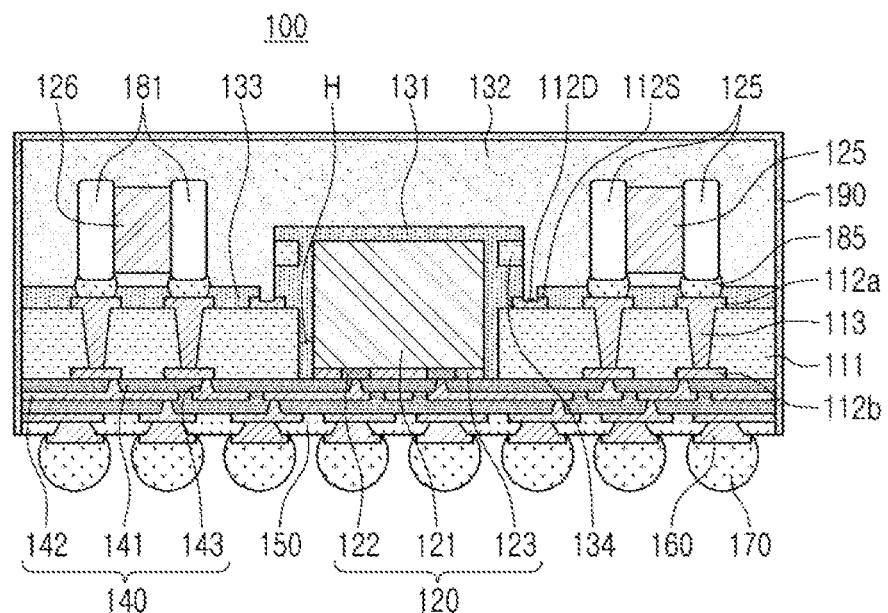
FIG. 9 is a schematic cross-sectional view illustrating an example of a semiconductor package.
Figure 10:
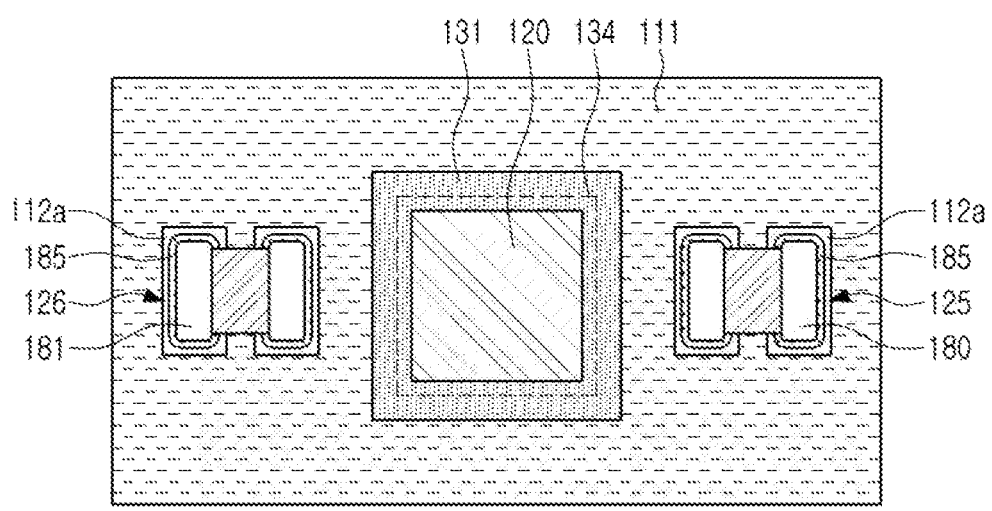
FIG. 10 is a plan view of the semiconductor package of FIG. 9 when viewed from above and illustrates a semiconductor chip and passive components as main components.

FIG. 9 is a schematic cross-sectional view illustrating an example of a semiconductor package. FIG. 10 is a plan view of the semiconductor package of FIG. 9 when viewed from above and illustrates a semiconductor chip and passive components as main components.

Referring to FIGS. 9 and 10, a semiconductor package 100 according to an exemplary embodiment may include a connection structure 140, a frame 111, a semiconductor chip 120, and passive components 125 and 126. The semiconductor chip 120 may be disposed in a through-hole H of the frame 111 so that connection pads 122 face the connection structure 140, and the passive components 125 and 126 may be disposed on the frame 111. In addition, the semiconductor chip 120 may be covered and protected by a first encapsulant 131, and the passive components 125 and 126 may be covered and protected by a second encapsulant 132. Although FIG. 9 illustrates that the semiconductor chip 120 and the passive components 125 and 126 are sealed by the first and second encapsulants 131 and 132, respectively, only some of the semiconductor chip 120 and the passive components 125 and 126 may also be covered as long as a protection function may be revealed.

In the semiconductor package 100 according to the present exemplary embodiment, the passive components 125 and 126 may be disposed and modularized in a single package together with the semiconductor chip 120. Therefore, an interval between the components may be significantly reduced, and a mounting area of the components on a printed circuit board such as a main board may be significantly reduced. In addition, electrical paths between the semiconductor chip 120 and the passive components 125 and 126 may be significantly reduced to solve a noise problem. Moreover, sealing processes of two steps or more may be performed rather than a single sealing, and therefore, a yield problem of the semiconductor chip 120 according to a mounting defect of the passive components 125 and 126, or an influence of foreign substances generated when the passive components 125 and 126 are mounted may be significantly reduced.

The connection structure 140 may include an insulating layer 141, a redistribution layer 142 disposed on the insulating layer 141, and a connection via 143 penetrating through the insulating layer 141 and connected to the redistribution layer 142. The connection structure 140 having the form as described above may redistribute the connection pads 122 of the semiconductor chip 120. In addition, the connection structure 140 may electrically connect the connection pads 122 of the semiconductor chip 120 to the passive components 125 and 126, or the like. Several tens to several millions of connection pads 122 of the semiconductor chip 120 having various functions may be redistributed by the connection structure 140. The connection structure 140 may be designed with a smaller number of layers or a larger number of layers than those illustrated in the drawing.

A material of each of the insulating layers 141 may be an insulating material. In this case, a photo imagable dielectric material such as a PID resin may also be used as the insulating material other than the insulating materials as described above. That is, the insulating layer 141 may be a photo imagable dielectric layer. When the insulating layer 141 has photo imagable dielectric property, the insulating layer 141 may be formed to have a smaller thickness, and a fine pitch of the connection via 143 may be achieved more easily. The insulating layer 141 may be a photo imagable dielectric layer including an insulating resin and inorganic filler. When the insulating layer 141 has multiple layers, materials of the multiple layers may be the same as each other, and may also be different from each other, if necessary. When the insulating layer 141 has the multiple layers, the multiple layers may be integrated with each other depending on a process, such that a boundary therebetween may also not be apparent.

The redistribution layer 142 may substantially serve to redistribute the connection pads 122. A material of the redistribution layer 142 may be a metal material such as copper (Cu), aluminum (Al), silver (Ag), tin (Sn), gold (Au), nickel (Ni), lead (Pb), titanium (Ti), or alloys thereof. The redistribution layer 142 may perform various functions depending on designs of a corresponding layer. For example, the redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include via pads, connection terminal pads, and the like.

The connection via 143 may electrically connect the redistribution layer 142, the connection pad 122, the passive components 125 and 126, or the like, formed on different layers to each other, resulting in electrical paths in the semiconductor package 100. A material of the connection via 143 may be a metal material such as copper (Cu), aluminum (Al), silver (Ag), tin (Sn), gold (Au), nickel (Ni), lead (Pb), titanium (Ti), or alloys thereof. The connection via 143 may be a field type via which is completely filled with the metal material, or a conformal type via in which the metal material is formed along a wall of the via.

The frame 111 may be disposed on the connection structure 140 and may have a through-hole H. The semiconductor chip 120, or the like may be disposed in the through-hole H. Although the present exemplary embodiment illustrates a structure having one through-hole H, the number of semiconductor chips 120 may be increased, or the number of through-holes H may be increased, if necessary. In addition, as shown, a thickness of the frame 111 may be smaller than that of the semiconductor chip 120, thereby reducing an overall thickness of the package 100. However, in some cases, the frame 111 may have the thickness which is equal to or greater than that of the semiconductor chip 120.

A material of the frame 111 is not particularly limited. For example, an insulating material may be used as the material of the frame 111. In this case, the insulating material may be a thermosetting resin such as an epoxy resin, a thermoplastic resin such as polyimide, a resin in which the thermosetting resin and the thermoplastic resins are impregnated together with an inorganic filler such as silica in a core material such as a glass fiber (or a glass cloth or a glass fabric), for example, prepreg, Ajinomoto Build-up Film (ABF), or the like.

A wiring layer 112a may be formed on an upper surface of the frame 111. In addition, a wiring layer 112b may also be formed on a lower surface of the frame 111. In this case, the wiring layer 112b on the lower surface of the frame 112 may be embedded in frame 111. As shown, the wiring layers 112a and 112b formed on the surfaces of the frame 111 may be connected to each other by a wiring via 113 penetrating through the frame 111. The wiring layer 112a may be disposed on a level between an active surface of the semiconductor chip 120 on which the connection pad 122 is disposed and an inactive surface of the semiconductor chip 120 opposing the active surface.

The wiring via 113 may electrically connect the wiring layers 112a and 112b formed on different layers to each other, resulting in an electrical path in the frame 111. A material of the wiring via 113 may also be a conductive material. The wiring via 113 may be completely filled with the conductive material, or the conductive material may be formed along a wall surface of a via hole. The wiring via 113 may also be formed by a known plating process, and may each include a seed layer and a conductor layer.

In the present exemplary embodiment, the passive components 125 and 126 may be surface-mounted (SMT) on the wiring layer 112a, and may be electrically and mechanically coupled to the wiring layer 112a by solders 185. When the passive components 125 and 126 are disposed on the frame 111, the passive components 125 and 126 may be surface-mounted unlike when the passive components 125 and 126 are disposed on the connection structure 140, and an advantage related to this will be described below.

Meanwhile, a portion of the wiring layer 112a disposed on the upper surface of the frame 111 may serve as an etch stop layer 112S disposed around the semiconductor chip 120, and may perform an etching stop function when laser processing for a periphery of the first encapsulant 131 is performed as described below.

The semiconductor chip 120 may be disposed in the through-hole H, and may be disposed on the connection structure 140 so that the connection pads 122 face the connection structure 140. The semiconductor chip 120 may be an integrated circuit (IC) provided in an amount of several hundreds to several millions of elements or more integrated in a single chip. In this case, the IC may be, for example, a power management IC (PMIC), but is not limited thereto, the IC may be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an analog-to-digital converter, an application-specific IC (ASIC), or the like.

The semiconductor chip 120 may be an integrated circuit in a bare state in which a separate bump or wiring layer is not formed. The integrated circuit may be formed on the basis of an active wafer. In this case, a base material of the body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like without being particularly limited. A passivation layer 123 exposing the connection pads 122 may be formed on the body 121, and may be an oxide film, a nitride film, or the like, or a double layer of the oxide film and the nitride film. An insulating layer (not shown), and the like, may be further disposed in other required positions. Meanwhile, a surface of the semiconductor chip 120 on which the connection pads 122 are disposed may be an active surface, and a surface of the semiconductor chip 120 opposing the active surface may be an inactive surface. In this case, when the passivation layer 123 is formed on the active surface of the semiconductor chip 120, the active surface of the semiconductor chip 120 may determine a positional relationship based on the lowest surface of the passivation layer 123.

The passive components 125 and 126 may be disposed on the frame 111, and specifically may be surface-mounted on the wiring layer 112a disposed on the upper surface of the frame 111. The passive components 125 and 126 may be capacitors such as multilayer ceramic capacitors (MLCCs) or low inductance chip capacitors (LICCs), inductors such as power inductors, and beads, respectively. The passive components 125 and 126 may be the same kind or different kinds of elements, and are illustrated as having the same size as each other, but may include different sizes. In addition, the number of passive components 125 and 126 is not particularly limited, but may be more than that illustrated in the drawing or be less than that illustrated in the drawing.

In the present exemplary embodiment, the passive components 125 and 126 are surface-mounted on the frame 111 without the need to embed the passive components 125 and 126 in the frame 111, and it is not necessary to limit the size and a material of external electrodes 180 and 181 (e.g., Cu electrodes) to facilitate embedding of the passive components 125 and 126. The outermost layers of the external electrodes 180 and 181 of the passive components 125 and 126 may include a Sn component, and as a result, the passive components 125 and 126 may be effectively mounted using a conductive adhesive material such as the solder 185. In addition, when the passive components 125 and 126 are embedded in the frame 111, it is difficult to tune a required capacity, but when the passive components 125 and 126 are surface-mounted on the frame 111, a tuning process may be effectively performed, which is more useful when the passive components 125 and 126 are for filters.

The first encapsulant 131 may cover the semiconductor chip 120. Specifically, the first encapsulant 131 may cover the upper surface of the semiconductor chip 120 while filling the through-hole H, and may extend to cover a portion of the upper surface of the frame 111. In this case, as described below, a side surface of the first encapsulant 131 may be a surface machined by laser machining or the like. In addition, as shown in the drawings, the first encapsulant 131 may cover a portion of an upper surface of the etch stop layer 112S disposed on the frame 111. A portion of the etch stop layer 112S may be in contact with a portion of the second encapsulant 132 which separates the first encapsulant 131 and the insulating layer 133 from each other. The etch stop layer 112S may have a dimple 112D filled with a portion of the second encapsulant 132 which separates the first encapsulant 131 and the insulating layer 133 from each other.

The first encapsulant 131 may include an insulating material, and the insulating material may be a material including an inorganic filler and an insulating resin, for example, a thermosetting resin such as an epoxy resin, a thermoplastic resin such as polyimide, a resin having a reinforcing material such as an inorganic filler included in the thermosetting resin and the thermoplastic resin, such as Ajinomoto Build-up Film (ABF), FR-4, Bismaleimide Triazine (BT), or the like. In addition, a molding material such as an epoxy molding compound (EMC) may be used, and a photo imagable dielectric material, that is, a photo imagable encapsulant (PIE) may also be used, if necessary. If necessary, a material in which an insulating resin such as a thermosetting resin or a thermoplastic resin is impregnated in inorganic filler and/or a core material such as a glass fiber (or a glass cloth or a glass fabric) may also be used as the insulating material. As an example, as in a description of a process to be described below, the first encapsulant 131 may be implemented by stacking and machining ABF layers. In addition, the first encapsulant 131 may include a heterogeneous material layer 134 exposed to a side surface thereof, and the heterogeneous material layer 134 may be exposed by laser machining as described below. The heterogeneous material layer 134 may be formed of the same material as that of the frame 111, but may be formed of a material different from that of the first encapsulant 131 and/or the second encapsulant 132. The heterogeneous material layer 134 may extend along a side of the first encapsulant 131. The heterogeneous material layer 134 may have a closed loop shape surrounding the semiconductor chip 120. A surface of the heterogeneous material layer 134 opposing the one surface thereof exposed from the first encapsulant 131 may be coplanar, or substantially coplanar, with a side surface of the frame 111 facing the semiconductor chip 120.

The second encapsulant 132 may cover the passive component 125 and 126 and may also cover the first encapsulant 131. In this case, the first and second encapsulants 131 and 132 may form a discontinuous interface. The second encapsulant 132 may be a molding layer using EMC or the like. Unlike this, the second encapsulant 132 may be formed of a material including an inorganic filler and an insulating resin, for example, a thermosetting resin such as an epoxy resin, a thermoplastic resin such as polyimide, a resin having a reinforcing material such as an inorganic filler impregnated in the thermosetting resin and the thermoplastic resin, such as the ABF, FR-4, BT, PID resin, or the like. If necessary, a material in which an insulating resin such as a thermosetting resin or a thermoplastic resin is impregnated in inorganic filler and/or a core material such as a glass fiber (or a glass cloth or a glass fabric) may also be used.

The first encapsulant 131 and the second encapsulant 132 may include the same material, and may include different materials. Even in the case in which the first encapsulant 131 and the second encapsulant 132 include the same material, a boundary therebetween may be confirmed. The first encapsulant 131 and the second encapsulant 132 may include similar materials and colors of the materials may be different from each other. For example, the first encapsulant 131 may be more transparent than the second encapsulant 132. That is, the boundary between the first and second encapsulants 131 and 132 may be apparent.

Meanwhile, an insulating layer 133 exposing the wiring layer 112 may be disposed on the upper surface of the frame 111. In this case, as shown, the insulating layer 133 may be separated from the first encapsulant 131 and may cover a portion of the upper surface of the etch stop layer 112S. In addition, as described above, the solders 185 may be disposed in regions penetrating through the insulating layer 133 between the passive components 125 and 126 and the wiring layer 112a. The insulating layer 133 may be formed of any material as long as the material has electrical insulation. However, the insulating layer 133 may be formed of the same material as that of the first encapsulant 131 in consideration of process efficiency, or the like. A thickness of a portion of the insulating layer 133 disposed on the frame 111 may be less than a thickness of a portion of the first encapsulant 131 disposed on the upper surface of the frame 111. The portion of the insulating layer 133 disposed on the frame 111 and the portion of the first encapsulant 131 disposed on the upper surface of the frame 111 may be made of the same material.

The passivation layer 150 may protect the connection structure 140 from external physical or chemical damage. The passivation layer 150 may have the openings exposing at least portions of the redistribution layer 142 of the connection structure 140. The number of openings formed in the passivation layer 150 may be several tens to several thousands. The passivation layer 150 may include an insulating resin and inorganic filler, but may not include a glass fiber. For example, the passivation layer 150 may be formed of ABF, but is not limited thereto.

The underbump metal layers 160 may improve connection reliability of the electrical connection metals 170, and thus improve board level reliability of the semiconductor package 100. The underbump metal layers 160 may be connected to the redistribution layer 142 of the connection structure 140 exposed through the openings of the passivation layer 150. The underbump metal layers 160 may be formed in the openings of the passivation layer 150 by the known metallization method using the known conductive material such as a metal, but are not limited thereto.

The electrical connection metals 170 may be configured to physically and/or electrically externally connect the semiconductor package 100. For example, the semiconductor package 100 may be mounted on the main board of the electronic device through the electrical connection metals 170. The electrical connection metals 170 may be formed of a low-melting point metal, for example, tin (Sn) or an alloy containing tin (Sn). More specifically, the electrical connection metals 170 may be formed of a solder, or the like. However, this is only an example, and a material of each of the electrical connection metals 170 is not particularly limited thereto. Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several thousands according to the number of connection pads 122, or may also be provided in an amount of several tens to several thousands or more or several tens to several thousands or less.

At least one of the electrical connection metals 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the package may be manufactured to have a small thickness, and may have price competitiveness.

An electromagnetic wave shielding layer 190 may be disposed on a surface of the second encapsulant 132, and as a result, EMI interference from the outside may be reduced. The electromagnetic wave shielding layer 190 may be formed of a magnetic or conductive material such as a metal or the like, and may be formed on the surface of the second encapsulant 132 by a sputtering or plating process. Unlike this, the electromagnetic wave shielding layer 190 may be previously manufactured in the form of a thin film and attached to the surface of the second encapsulant 132. However, the electromagnetic wave shielding layer 190 is not an essential component and may be omitted in some cases. As shown, the electromagnetic wave shielding layer 190 may extend from the surface of the second encapsulant 132 so as to cover side surfaces of the frame 111 and the connection structure 140, and as a result, a shielding performance may be more improved. In addition, the electromagnetic wave shielding layer 190 may also be connected to a portion of the redistribution layer 142 of the connection structure 140, for example, the ground layer.

FIGS. 11 through 20 are schematic views illustrating an example of processes of manufacturing the semiconductor package of FIG. 9.

Figure 11:
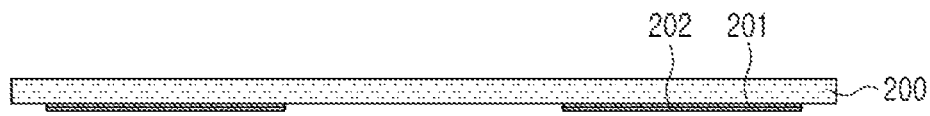
FIGS. 11 through 20 are schematic views illustrating an example of processes of manufacturing the semiconductor package of FIG. 9.
Figure 12:
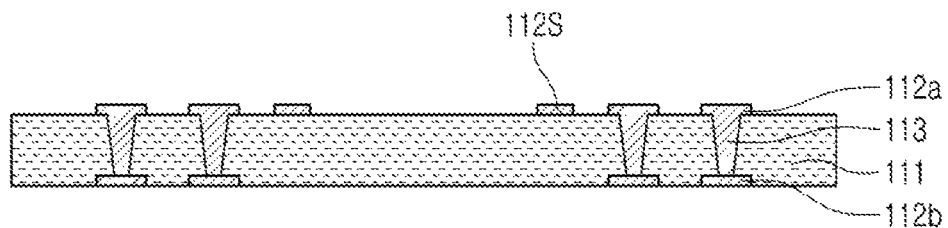

First, as illustrated in FIGS. 11 and 12, a support member 200 and a frame 111 may be prepared. The support member 200 may serve to support the second encapsulant 132 when the second encapsulant 132 is formed thereon, and may include peelable metal layers 201 and 202 so that the peelable metal layers 201 and 202 may be removed in a subsequent process. In the metal layers 201 and 202, an edge region, and a central region in which the semiconductor chip 120 is to be disposed, may be appropriately removed. The frame 111 may include wiring layer 112a and 112b and a wiring via 113, and an etch stop layer 112S may be disposed around the central region in which the semiconductor chip 120 is to be disposed. The wiring layer 112a and the etch stop layer 112S may be made of the same material and by the same process, although the present disclosure is not limited thereto. For example, one layer, deposited on the upper surface of the frame, may be patterned to form the wiring layer 112a and the etch stop layer 112S. The support member 200 and the frame 111 may be formed of a material such as, for example, a prepreg, or the like, and may be formed of the same material as each other.

Figure 13:
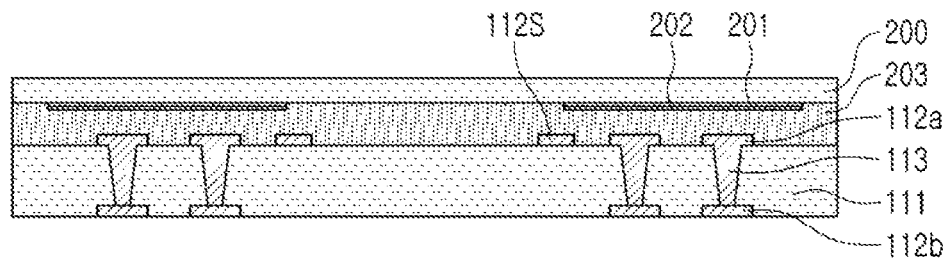

Next, as illustrated in FIG. 13, the support member 200 and the frame 111 may be coupled to each other, and a lamination layer 203 may be interposed therebetween. The lamination layer 203 may be formed of a material such as ABF, or the like. By a subsequent process to be described later, a portion of the lamination layer 203 may remain, which will become a portion of the first encapsulant 131, and the other portion thereof may remain, which will become the insulating layer 133.

Figure 14:
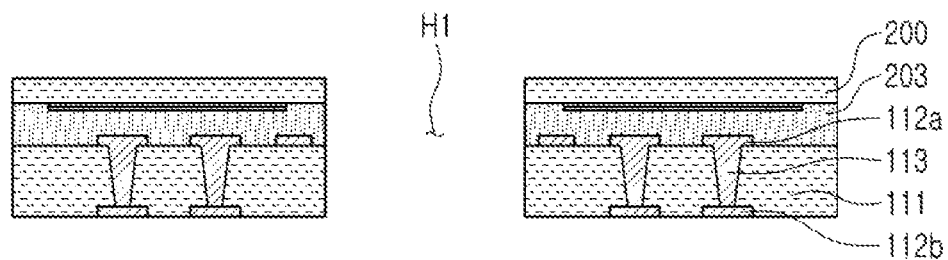

Next, as shown in FIG. 14, a through-hole H1 may be formed in the support member 200 and the frame 111. The through-hole may be formed by a laser drill and/or a mechanical drill or sandblast. Therefore, first through-holes 110HA1 and 110HA2 and a preliminary second through-hole 110HB' may be formed. Next, a first adhesive film 210 may be attached to a lower side of the frame 110.

Figure 15:
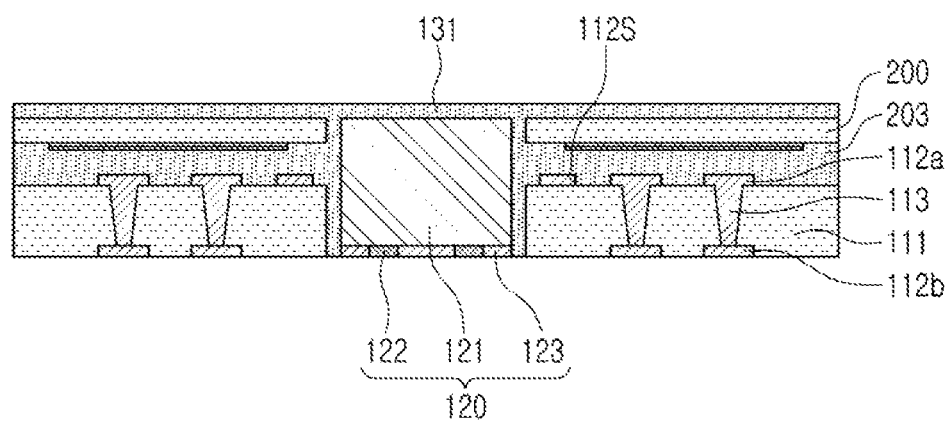

Next, as shown in FIG. 15, the semiconductor chip 120 may be disposed in the through-hole of the frame 111, and an insulating layer such as ABF may be then formed to cover an inactive surface of the semiconductor chip 120, thereby implementing the first encapsulant 131. For the present process to dispose the semiconductor chip 120 and implement the first encapsulant 131, the first adhesive tape 210 may be disposed below the frame 111. Therefore, the first adhesive tape 210 may be removed.

Figure 16:
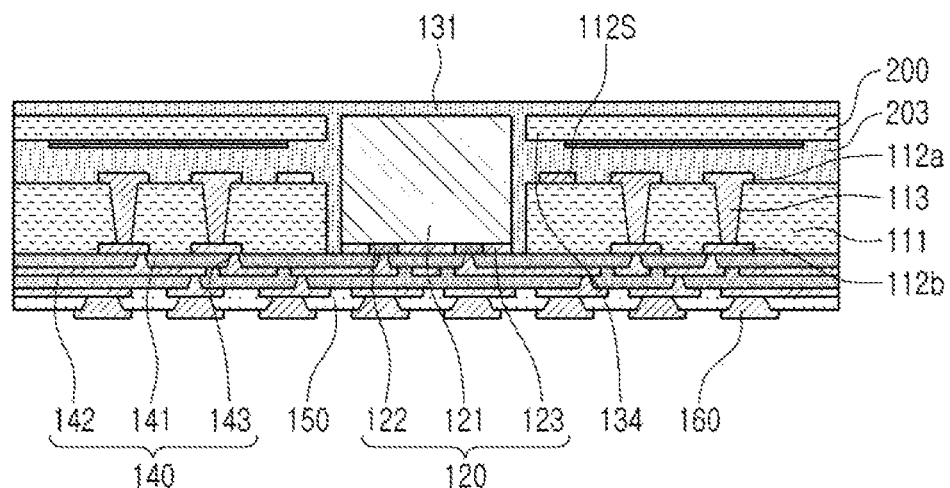
Figure 17:
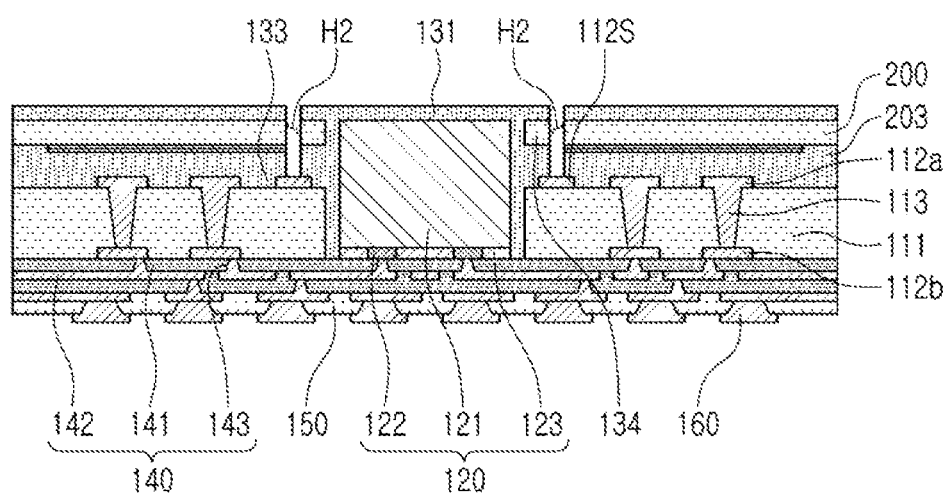

Then, as shown in FIG. 16, a connection structure 140 may be formed to be adjacent to the connection pads 122 of the semiconductor chip 120 so as to be connected to the connection pads 122. The insulating layer 141 may be obtained by stacking laminations of photo imagable dielectric (PID), the redistribution layer 142 may be obtained by a known pattern forming process such as plating, and the connection via 143 may be obtained by exposing and developing the insulating layer 141 to form a hole and then filling the hole with a conductive material. Next, a passivation layer 150 may be formed to cover the connection structure 140 by a known lamination method or a coating method. In addition, an underbump metal layer 160 may be formed by a plating process, and the underbump metal layer 160 may also include a seed layer and a conductor layer. Meanwhile, in order to form the connection structure 140 and the like described above, a carrier (not shown) may be coupled onto the first encapsulant 131.

Figure 18:
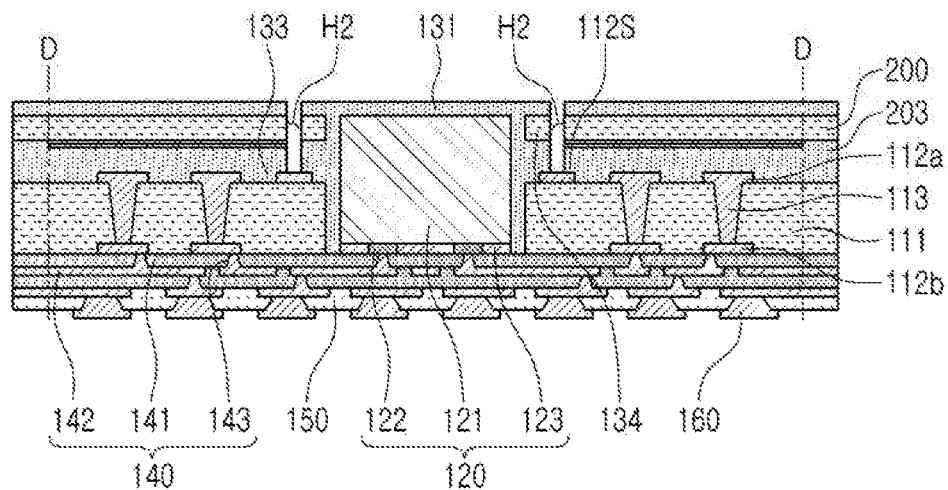

Next, after removing the carrier, a periphery of the semiconductor chip 120 may be machined by a device such as a laser to partially remove the first encapsulant 131, the support member 200, and the lamination layer 203, thereby forming a hole H2. In this case, the frame 111 or the like may be protected from a machining means such as the laser by the etch stop layer 112S. Due to a slight over etching, a portion of the etch stop layer 112S, exposed by the hole H2, may be removed. In this case, the etch stop layer 112S may have a dimple 112D formed by the over etch. By the present process, the first encapsulant 131 may be completed, and a heterogeneous material layer 134, as a remaining portion of the support member 200 may be embedded in the first encapsulant 131 and exposed from a side surface of the first encapsulant 131 by the hole H2. Thereafter, as shown in FIG. 18, an individualization process may be performed in a single package unit along a dicing line D.

Figure 19:
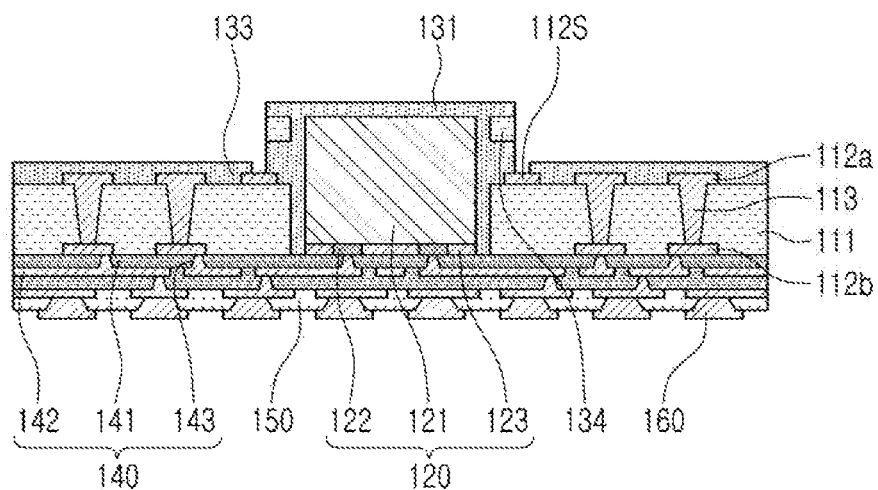

Next, as shown in FIG. 19, the portions of the support member 200, separated from other portions by the hole H2, may be separated from the frame 111 or the like, and may be effectively removed by using the metal layers 201 and 202 described above. After the machining process and the removal of the support member 200, the insulating layer 133 originated from the lamination layer 203 may remain on the frame 111, and the insulating layer 133 may be spaced apart from the first encapsulant 131 by a predetermined interval.

Figure 20:
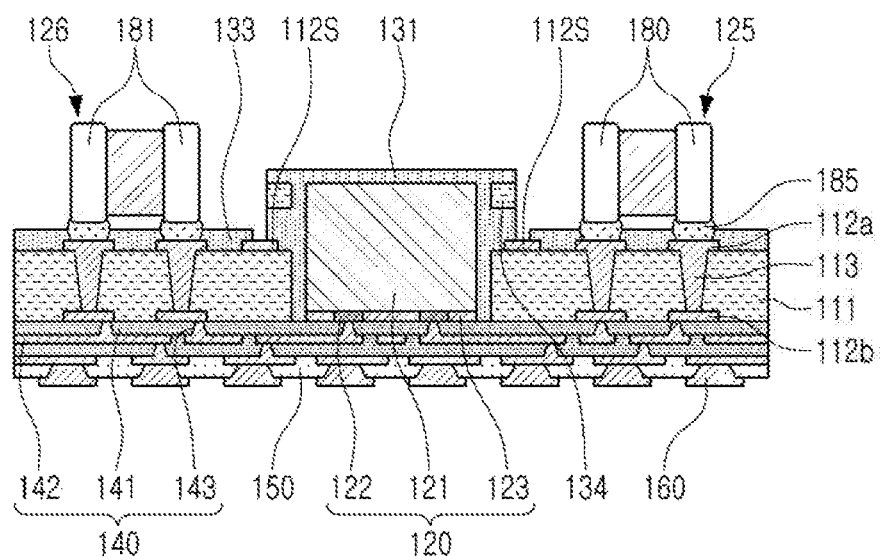

Thereafter, as shown in FIG. 20, the insulating layer 133 may be partially removed to expose the wiring layer 112, and the passive components 125 and 126 may be disposed on the exposed wiring layer 112. As described above, the passive components 125 and 126 may be surface-mounted by using the solder or the like, and a capacity tuning of the passive components 125 and 126 may be performed during the present mounting process. Thereafter, a second encapsulant 132 may be formed to cover the passive components 125 and 126 and the first encapsulant 131, and an EMC molding process may be used.

FIGS. 21 through 24 illustrate a semiconductor package according to a modified example. Hereinafter, modified portions in the above-described exemplary embodiments will be mainly described.

Figure 21:
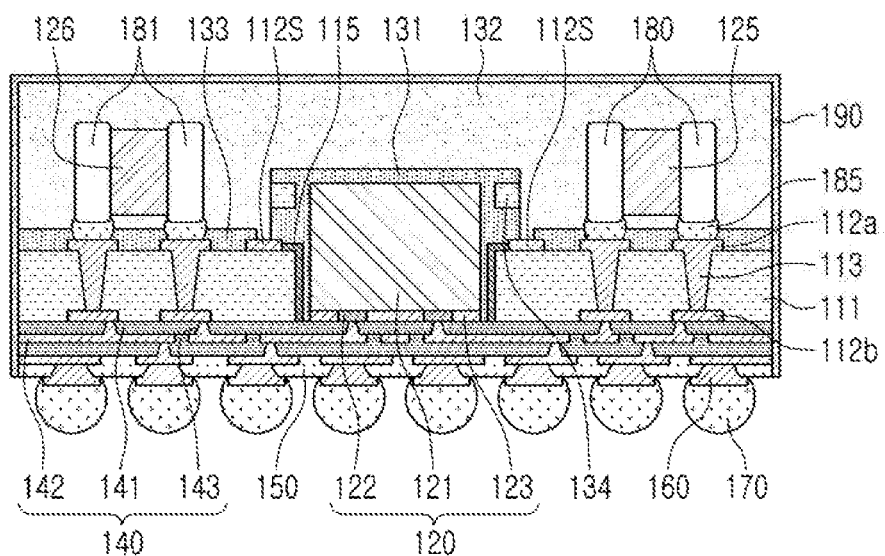
FIGS. 21 through 24 illustrate a semiconductor package according to a modified example.

First, in a case of an exemplary embodiment of FIG. 21, the frame 111 has a structure in which a metal layer 115 covering a side wall of a through-hole is formed, and may perform an electromagnetic wave shielding function, a heat dissipation function, and the like. The metal layer 115 may include copper (Cu), aluminum (Al), silver (Ag), tin (Sn), gold (Au), nickel (Ni), lead (Pb), titanium (Ti), or alloys thereof, but is not limited thereto. The metal layer 115 may extend to an upper surface of the frame 111 to connect to the wiring layer 112 and may also be used as a ground. In this case, the metal layer 115 may be electrically connected to a ground of the redistribution layer 142 of the connection structure 140.

Figure 22:
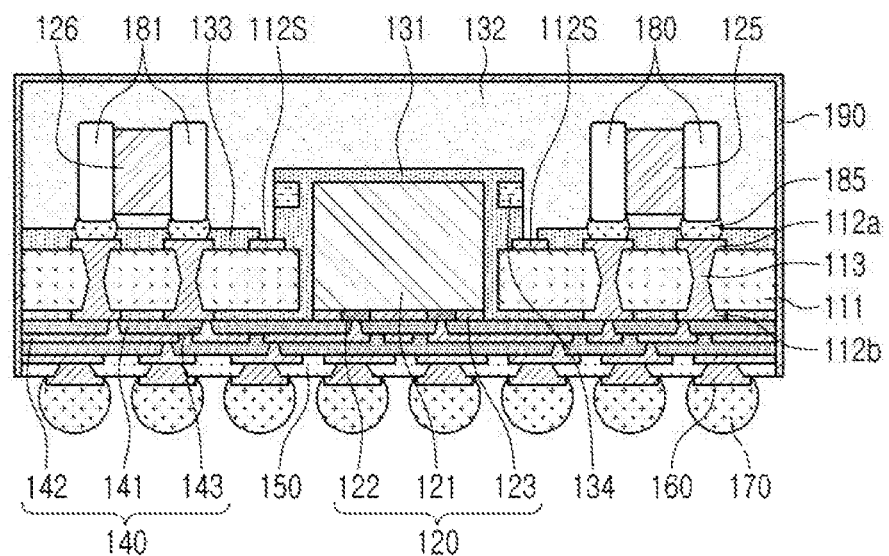

A semiconductor package according to an exemplary embodiment of FIG. 22 may include first and second wiring layers 112a and 112b disposed on a lower surface and an upper surface of the frame 111, respectively, and wiring vias 113 penetrating through the frame 111 and electrically connecting the first and second wiring layers 112a and 112b to each other. Unlike the above-mentioned exemplary embodiment, the wiring layer 112b below the frame 111 may protrude from the lower surface of the frame 111. In addition, as shown, the wiring vias 113 may have an hourglass shape.

Figure 23:
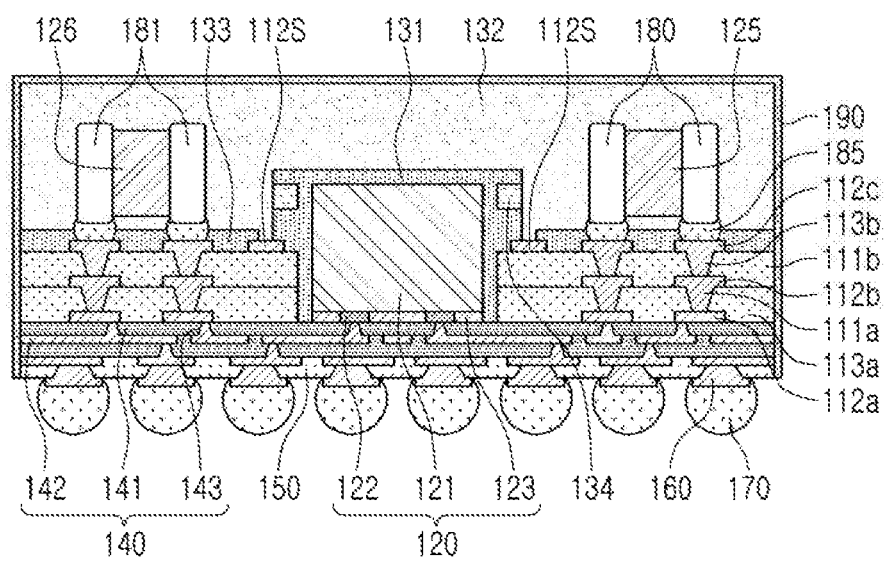

A semiconductor package according to an exemplary embodiment of FIG. 23 may also have a modified form of the frame, and may include a first frame 111a in contact with a connection structure 140, a first wiring layer 112a in contact with the first frame 111a and embedded in the first frame 111a, a second wiring layer 112b disposed on the other surface of the first frame 111a opposing one surface of the first frame 111a in which the first wiring layer 112a is embedded, a second frame 111b disposed on the first frame 111a and covering at least a portion of the second wiring layer 112b, and a third wiring layer 112c disposed on the second frame 111b. The first to third wiring layers 112a, 112b, and 112c may be electrically connected to connection pads 122. The first and second wiring layers 112a and 112b and the second and third wiring layers 112b and 112c may be electrically connected to each other through first and second wiring vias 113a and 113b penetrating through the first and second frames 111a and 111b, respectively.

The first wiring layer 112a may be recessed into the first frame 111a. As described above, when the first wiring layer 112a is recessed into the first frame 111a and a lower surface of the first frame 111a and a lower surface of the first wiring layer 112a have a step therebetween, a phenomenon in which a material of the first encapsulant 131 bleeds to pollute the first wiring layer 112a may be prevented. A thickness of each of the wiring layers 112a, 112b, and 112c may be greater than that of the redistribution layer 142 of the connection structure 140.

A material of each of the frames 111a and 111b is not particularly limited. For example, an insulating material may be used as the material of the frames 111a and 111b. In this case, a thermosetting resin such as an epoxy resin, a thermoplastic resin such as polyimide, a resin in which the thermosetting resin and the thermoplastic resin are mixed with an inorganic filler, for example, an Ajinomoto Build-up Film (ABF), or the like, may be used as the insulating material. Alternatively, a PID resin may also be used as the insulating material.

When holes for the first wiring vias 113a are formed, some of the pads of the first wiring layer 112a may serve as a stopper, and it may thus be advantageous in a process that each of the first wiring vias 113a has the tapered shape of which a width of an upper surface is greater than that of a lower surface. In this case, the first wiring vias 113a may be integrated with pad patterns of the second wiring layer 112b. In addition, when holes for the second wiring vias 113b are formed, some of the pads of the second wiring layer 112b may serve as a stopper, and it may thus be advantageous in a process that each of the second wiring vias 113b has the tapered shape of which a width of an upper surface is greater than that of a lower surface. In this case, the second wiring vias 113b may be integrated with pad patterns of the third wiring layer 112c.

Figure 24:
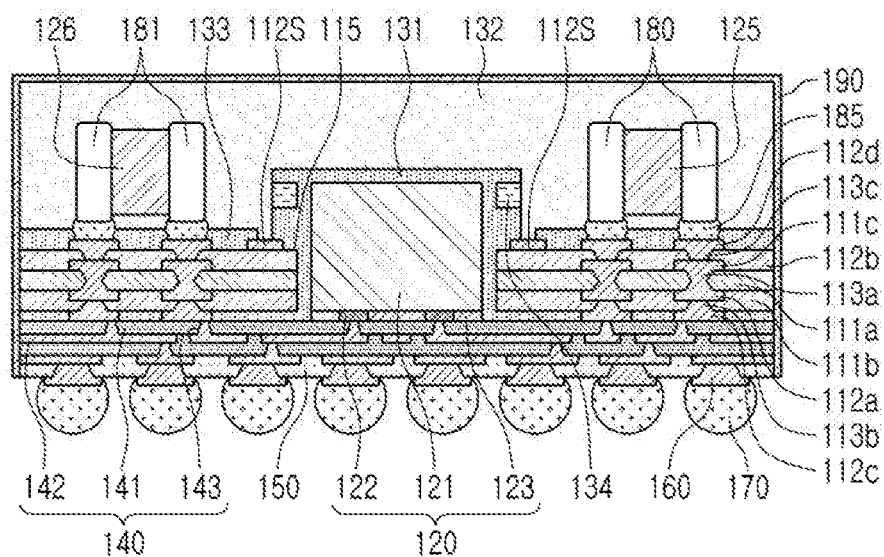

In a case of an exemplary embodiment of FIG. 24, a semiconductor package may include a first frame 111a, a first wiring layer 112a and a second wiring layer 112b which are disposed a lower surface and an upper surface of the first frame 111a, respectively, a second frame 111b disposed the lower surface of the first frame 111a and covering at least a portion of the first wiring layer 112a, a third wiring layer 112c disposed on a lower surface of the second frame 111b, a third frame 111c disposed on the upper surface of the first frame 111a and covering at least a portion of the second wiring layer 112b, and a fourth wiring layer 112d disposed on an upper surface of the third frame 111c. The first to fourth wiring layers 112a, 112b, 112c, and 112d may be electrically connected to connection pads 122. Since the frame may include a large number of wiring layers 112a, 112b, 112c, and 112d, a connection structure 140 may be further simplified. Therefore, a decrease in a yield depending on a defect occurring in a process of forming the connection structure 140 may be suppressed. Meanwhile, the first to fourth wiring layers 112a, 112b, 112c, and 112d may be electrically connected to each other through first to third wiring vias 113a, 113b, and 113c each penetrating through the first to third frames 111a, 111b, and 111c.

The first frame 111a may include an insulating material different from those of the second frame 111b and the third frame 111c. For example, the first frame 111a may be, for example, prepreg including a core material, a filler, and an insulating resin, and the second frame 111b and the third frame 111c may be an ABF or a PID including a filler and an insulating resin, but are not limited thereto. Similarly, the first wiring vias 113a penetrating through the first frame 111a may have a diameter greater than those of second and third wiring vias 113b and 113c each penetrating through the second and third frames 111b and 111c. Similarly, a thickness of each of the wiring layers 112a, 112b, 112c, and 112d of the core member 110 may be greater than that of the redistribution layer 142 of the connection structure 140.

Figure 25:
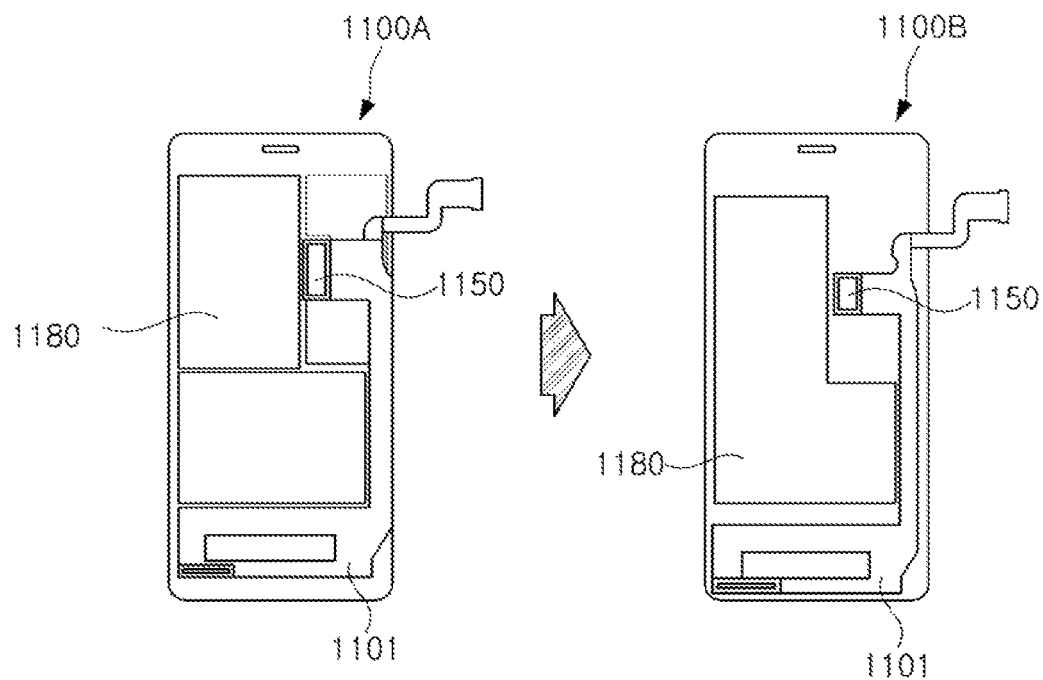
FIG. 25 is a schematic plan view illustrating an effect when the semiconductor package according to the exemplary embodiments in the present disclosure is applied to the electronic device.

FIG. 25 is a schematic plan view illustrating an effect when the semiconductor package according to the exemplary embodiments in the present disclosure is applied to the electronic device.

Referring to FIG. 25 recently, in accordance with an increase in a size of displays for mobile devices 1100A and 1100B, the necessity to increase capacity of batteries has increased. In accordance with the increase in the capacity of the batteries, an area occupied by the battery 1180 in the mobile device has increased, and it has been thus required to reduce a size of a printed circuit board 1101 such as a main board. As a result, due to a reduction in the mounting area of the components, an area occupied by a module 1150 including the PMIC and the passive components accordingly becomes continuously small. In this case, when the semiconductor package according to the above-described exemplary embodiments is applied to the module 1150, since the size may be significantly reduced, the reduced area may also be effectively used.

In the present disclosure, terms "lower side", "lower portion", "lower surface", and the like, have been used to indicate a downward direction in relation to cross sections of the drawings, and terms "upper side", "upper portion", "upper surface", and the like, have been used to indicate a direction opposing the direction indicated by the terms "lower side", "lower portion", "lower surface", and the like. However, these directions are defined for convenience of explanation, and the claims are not particularly limited by the directions defined as described above, and the concept of the upper portion and the lower portion may be changed at any time.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, the mounting area of the semiconductor chip and the passive components may be significantly reduced, and the electrical paths between the semiconductor chip and the passive components may be significantly reduced. Further, by disposing the passive components on the frame, the semiconductor package capable of being surface-mounted and tuning capacity may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a connection structure including an insulating layer, a redistribution layer disposed on the insulating layer, and a connection via penetrating through the insulating layer and connected to the redistribution layer;
   a frame disposed on the connection structure and having a through-hole;
   a semiconductor chip disposed in the through-hole on the connection structure and having a connection pad facing the connection structure;
   a passive component disposed on the frame;
   a first encapsulant covering at least a portion of the semiconductor chip and a second encapsulant covering at least a portion of the passive component; and
   a wiring layer disposed on an upper surface of the frame, wherein the passive component is surface-mounted on the wiring layer.

2. The semiconductor package of claim 1, wherein the second encapsulant covers a top surface and side surfaces of the first encapsulant.

3. The semiconductor package of claim 1, wherein the first and second encapsulants form a discontinuous interface.

4. The semiconductor package of claim 3, wherein the first encapsulant is an Ajinomoto Build-up Film (ABF) layer, and
   the second encapsulant is a molding layer.

5. The semiconductor package of claim 1, wherein the first encapsulant covers an upper surface of the semiconductor chip while filling the through-hole, and extends to cover a portion of the upper surface of the frame.

6. The semiconductor package of claim 1, wherein an outermost layer of an external electrode of the passive component includes a tin (Sn) component.

7. The semiconductor package of claim 1, wherein a portion of the wiring layer is an etch stop layer disposed around the semiconductor chip, and
   the first encapsulant covers a portion of an upper surface of the etch stop layer.

8. The semiconductor package of claim 7, further comprising a second insulating layer disposed on the upper surface of the frame and having an opening exposing a portion of the wiring layer, and
   the insulating layer is spaced apart from the first encapsulant and covers a portion of the upper surface of the etch stop layer.

9. The semiconductor package of claim 8, wherein the second insulating layer and the first encapsulant are formed of the same material.

10. The semiconductor package of claim 8, wherein a thickness of a portion of the second insulating layer disposed on the frame is less than a thickness of a portion of the first encapsulant disposed on the upper surface of the frame.

11. The semiconductor package of claim 8, further comprising a solder filling at least a portion of the opening in the second insulating layer and disposed between an external electrode of the passive component and the portion of the wiring layer.

12. The semiconductor package of claim 7, wherein the second encapsulant contacts the etch stop layer.

13. The semiconductor package of claim 7, wherein the etch stop layer has a dimple which is filled with a portion of the second encapsulant.

14. The semiconductor package of claim 1, wherein the wiring layer is disposed on a level between an active surface of the semiconductor chip on which the connection pad is disposed and an inactive surface of the semiconductor chip opposing the active surface.

15. A semiconductor package comprising:
   a connection structure including an insulating layer, a redistribution layer disposed on the insulating layer, and a connection via penetrating through the insulating layer and connected to the redistribution layer;
   a frame disposed on the connection structure and having a through-hole;
   a semiconductor chip disposed in the through-hole on the connection structure and having a connection pad facing the connection structure;
   a passive component disposed on the frame;
   a first encapsulant covering at least a portion of the semiconductor chip and a second encapsulant covering at least a portion of the passive component; and
   a heterogeneous material layer embedded in the first encapsulant and having one surface exposed from a side surface of the first encapsulant.

16. The semiconductor package of claim 15, wherein the second encapsulant covers the one surface of the heterogeneous material layer exposed from the side surface of the first encapsulant.

17. The semiconductor package of claim 15, wherein a surface of the heterogeneous material layer opposing the one surface thereof exposed from the first encapsulant is substantially coplanar with a side surface of the frame facing the semiconductor chip.

18. The semiconductor package of claim 15, wherein the heterogeneous material layer is formed of the same material as that of the frame, and is formed of a material different from that of the first encapsulant.

19. A semiconductor package comprising:

a connection structure including an insulating layer, a redistribution layer disposed on the insulating layer, and a connection via penetrating through the insulating layer and connected to the redistribution layer;

a frame disposed on the connection structure and having a through-hole;

a semiconductor chip disposed in the through-hole on the connection structure and having a connection pad facing the connection structure;

a passive component disposed on the frame;

a first encapsulant covering at least a portion of the semiconductor chip and a second encapsulant covering at least a portion of the passive component; and an electromagnetic wave shielding layer disposed on a surface of the second encapsulant.

20. The semiconductor package of claim 19, wherein the electromagnetic wave shielding layer extends from the surface of the second encapsulant to cover side surfaces of the frame and the connection structure.

21. The semiconductor package of claim 20, wherein the electromagnetic wave shielding layer is connected to a portion of the redistribution layer of the connection structure.

* * * * *